United States Patent [19]

Maida

[11] 3,909,635

[45] Sept. 30, 1975

[54] CYCLING TIMER APPARATUS WITH AUTOMATIC INTERRUPTION AND HOLD

[75] Inventor: Osamu Maida, Tokyo, Japan

[73] Assignee: Nippon Kogaku K.K., Tokyo, Japan

[22] Filed: Dec. 26, 1973

[21] Appl. No.: 427,656

[30] Foreign Application Priority Data

| | | |
|---|---|---|
| Dec. 28, 1972 | Japan | 48-3889 |
| Dec. 28, 1972 | Japan | 48-3890 |
| Dec. 28, 1972 | Japan | 48-3891 |
| Dec. 28, 1972 | Japan | 48-3892 |

[52] U.S. Cl. ............ 307/293; 307/247 A; 307/265; 328/129; 331/113 R; 354/44

[51] Int. Cl.$^2$. H03K 5/13; H03K 5/04; H03K 3/281

[58] Field of Search ......... 331/111, 113 R; 307/265, 307/273, 283, 293, 247 R; 352/141; 354/44; 328/129–131

[56] References Cited

UNITED STATES PATENTS

| | | | |
|---|---|---|---|
| 3,125,730 | 3/1964 | Levy et al. | 307/265 |
| 3,328,724 | 6/1967 | Way | 331/113 |
| 3,388,346 | 6/1968 | Roof et al. | 331/111 |
| 3,582,687 | 6/1971 | Bellomo | 307/273 |
| 3,611,204 | 10/1971 | Boenning et al. | 307/273 |

*Primary Examiner*—Stanley D. Miller, Jr.
*Attorney, Agent, or Firm*—Shapiro and Shapiro

[57] ABSTRACT

Timers for controlling load circuits, such as motors in motor-driven cameras, have ON and OFF intervals which can either be continuously repeated or automatically interrupted after various selected sequences of ON-OFF operations for thereafter holding the load circuit in an energized or de-energized state. The timers comprise a bi-stable circuit having complementary output signals and a pair of CR time-delay circuits for generating time-delayed signals in response to the output signals, the time-delayed signals being coupled to respective inputs of the bi-stable circuit for causing the bi-stable circuit to be alternately set in first and second states. A load responsive to one of the output signals is energized or de-energized in accordance with the state of the bi-stable circuit. An interrupter circuit responsive to one of the time-delayed signals causes the load to be continuously energized or de-energized after a selected ON-OFF sequence.

15 Claims, 14 Drawing Figures

CYCLING TIMER APPARATUS WITH AUTOMATIC INTERRUPTION AND HOLD

1. Field of the Invention

The present invention relates to CR timers for controlling load circuits, the timers having independently selectable ON and OFF intervals which may be continuously repeated or automatically interrupted after a selected sequence of ON-OFF operations for thereafter holding the load circuit in a predetermined state, and is more particularly directed to self-timing motor control circuits for motor-driven cameras.

2. Description of the Prior Art

U.S. Pat. No. 3,703,649, issued Nov. 21, 1972, to Osamu Maida, shows a timer circuit for actuating a camera, the timer circuit including first and second timing circuits and first and second start control circuits. Each timing circuit consists of an integrating time constant circuit having a resistor and a capacitor connected in series, a level detecting and trigger circuit and a hold circuit. The first and second start control circuits are interconnected between a power source and the first and second timing circuits, respectively, in such a manner that each start control circuit is connected or disconnected by a control signal derived from the other start control circuit.

The timing circuits are alternately actuated by the start control circuits, and the outputs from the two timing circuits are applied to an AND gate to generate an actuating signal for controlling the camera. Switches are provided in the timer circuit so as to selectively establish the timer circuit in one of various modes of operation.

However, the above-described timing circuit is disadvantageous in that when the timer is repeatedly actuated, the holding time of the first actuation differs from the holding time of each of the subsequent actuations. Furthermore, operation of the timer is adversely affected by variations of the source voltage.

SUMMARY OF THE INVENTION

It is therefore an object of this invention to provide an improved timer which is operable not only in a continuously cycling mode but also in any one of four other modes of operation described hereinafter.

It is a further object of the invention to provide a timer having stable operation in spite of variations of the source voltage.

In accordance with the invention, five modes of operation of a load control circuit are provided by the combination of a repeat cycle CR timer and an interruption circuit. In the first mode of operation, the load control circuit is continuously cycled ON and OFF at a predetermined rate. In the second mode of operation, when an operation switch is actuated, the load control circuit is first driven into and held in the ON state for a predetermined time interval and then is driven into and continuously held in the OFF state. In the third mode of operation, when the operation switch is actuated, the load control circuit is first driven into and held in the OFF state for a predetermined time interval and then is driven into and continuously held in the ON state. In the fourth mode of operation, when the operation switch is actuated, the load control circuit is first driven into and held in the OFF state for a predetermined time interval, is then driven into and held in the ON state for another predetermined time interval, and is thereafter driven into and continuously held in the OFF state. In the fifth mode of operation, when the operation switch is actuated, the load control circuit is first driven into and held in the ON state for a predetermined time interval, is then driven into and held in the OFF state for another predetermined time interval, and is thereafter driven again into and continuously held in the ON state.

BRIEF DESCRIPTION OF THE DRAWINGS

Throughout the figures, the same reference numerals are used to designate similar parts.

DESCRIPTION OF THE PREFERRED EMBODIMENTS

Figure 1:
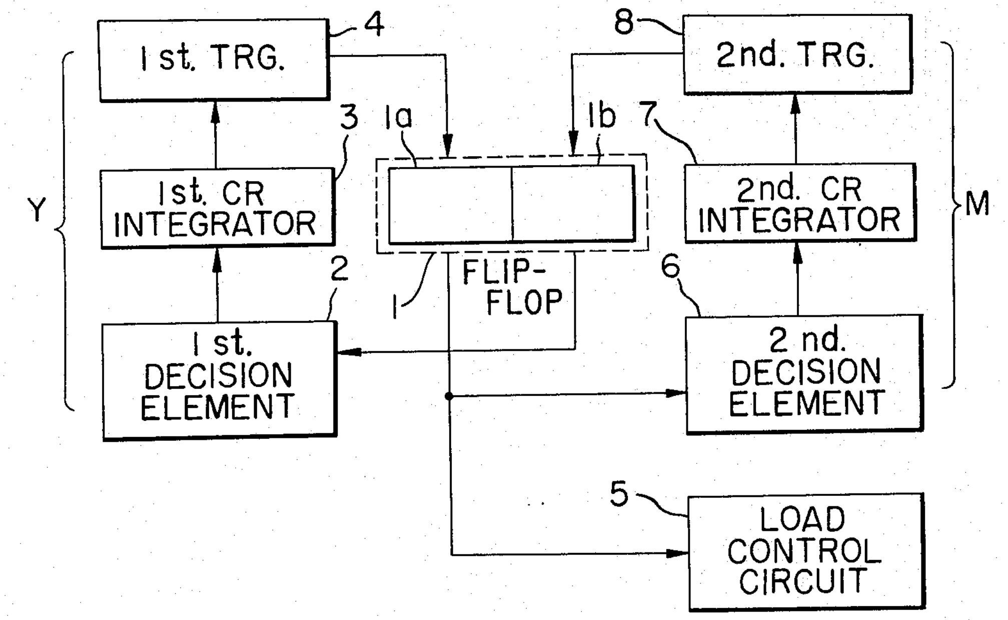
FIG. 1 is a block diagram of a first embodiment of a load control timer in accordance with the present invention.
Figure 2:
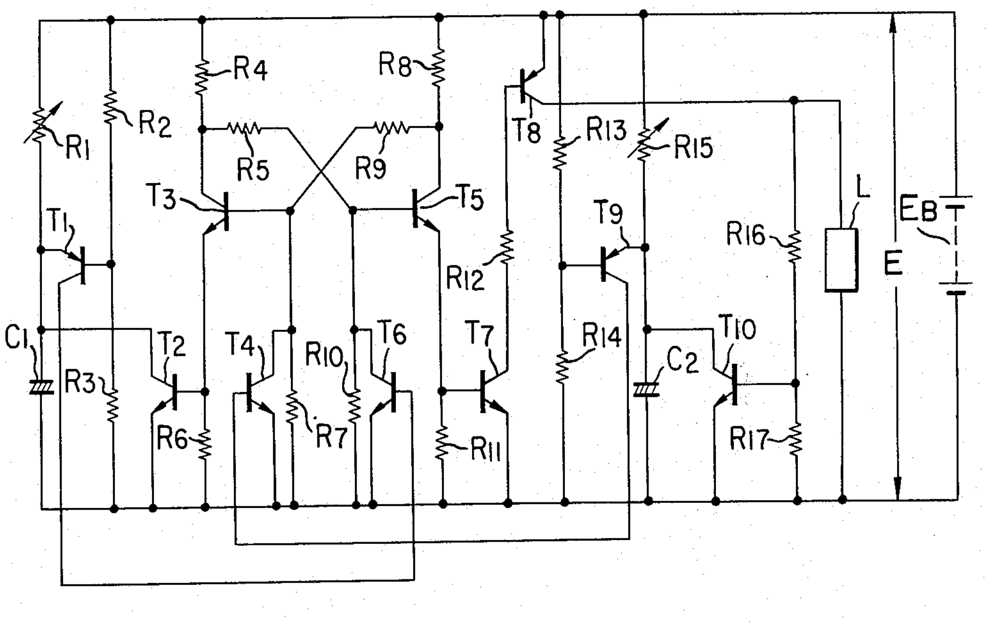
FIG. 2 is a circuit diagram thereof.
Figure 3:
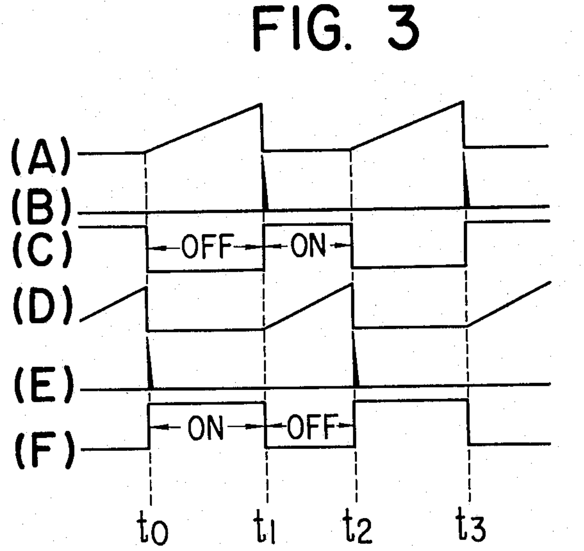
FIG. 3 is an explanatory timing diagram illustrating the first mode of operation thereof.

First Embodiment, FIGS. 1, 2 and 3

FIG. 1 shows in block diagram the first embodiment of a repeat cycle CR timer capable of the first mode of operation wherein the timer is continuously cycled ON and OFF at a predetermined rate. A bi-stable circuit or flip-flop 1 comprises a pair of amplifier elements 1*a* and 1*b* interconnected with each other with positive feedback, so that when the amplifier element 1*a* is in the ON state the other element 1*b* is in the OFF state, and vice versa. When the element 1*b* is in the ON state, a first initial state decision element 2 is driven into the state for completely discharging the capacitor in a first CR integrator 3 comprising the capacitor and a resistor (hereinafter referred to as the initial integration state), but when the amplifier 1*b* is in the OFF state, the decision element 2 is driven into the state for releasing the capacitor from the initial state to thereby initiate the integration operation of the CR integrator 3. When the voltage across the capacitor in the first CR integrator 3 reaches a predetermined level, a first threshold detector or trigger circuit 4 provides a trigger signal which is applied to element 1*a* of the flip-flop 1, so that element 1*a* is driven into the OFF state and element 1*b* into the ON state.

A load control circuit 5 is driven into the ON state when the element 1*a* is driven into the ON state and is driven into the OFF state when the element 1*a* is driven into the OFF state, thereby controlling a load. A second initial state decision element 6 is driven into the state for setting the CR integrator 7 to the initial state when the element 1*a* is driven into the ON state, so that the capacitor in a second CR integrator comprising the capacitor and a resistor is completely discharged (the initial integration state). When the element 1*a* is driven into the OFF state, the second decision element is driven into the state for releasing the capacitor from the initial state so that the operation of the second CR integrator 7 is initiated. A second trigger circuit 8 provides a trigger signal when the voltage across the capacitor in the second CR integrator 7 reaches a predetermined level. In response to a trigger signal from the second threshold detector or trigger circuit 8, the element 1*b* in the flip-flop circuit 1 is driven into the OFF state and the element 1*a* is driven into the ON state.

Operation of the timer in the first mode will now be described. Assume that the elemenet 1*a* in the flip-flop 1 is driven into the ON state and the element 1*b* into the OFF state. Then the first decision element 2 is driven into the state for releasing the capacitor in the first CR integrator from the initial state so that the integrating operation of the first CR integrator is initiated. Since the element 1*a* is in the ON state, the load control circuit 5 is also in the ON state. The second decision element 6 is in the state for discharging the capacitor in the second CR integrator 7 so that the second CR integrator is driven into the initial integration state. When the voltage across the integrating capacitor in the first CR integrator 3 reaches a predetermined level, the first trigger circuit 4 provides a trigger signal in response to which element 1*a* is driven into the OFF state and element 1b into the ON state. Then the load control circuit 5 is driven into the OFF state and the second decision element is driven into the state for releasing the second CR integrator 7 from the initial integration state. As a result, the second CR integrator 7 starts its integrating operation. Since the element 1*b* is in the ON state, the first decision element 2 is in the state for holding the first CR integrator 3 in the initial integration state. When the voltage across the capacitor in the second CR integrator 7 reaches a predetermined level, the second trigger circuit 8 provides a trigger signal to element 1*b* in the flip-flop 1, and element 1*b* is then driven into the OFF state and element 1*a* into the ON state. Thus, the repeat cycle CR timer is returned to its initial condition, and the operation described above is repeated.

In the repeat cycle CR timer shown in FIG. 1, the circuits 2, 3 and 4 comprise a first delay circuit Y and the circuits 6, 7, and 8 a second delay circuit M.

FIG. 2 is a circuit diagram of the repeat cycle CR timer shown in block diagram in FIG. 1. The flip-flop 1 comprises resistors R4–R11 and transistors T3 and T5, which correspond to the amplifier elements 1*b* and 1*a*, respectively. The first CR integrator comprises a resistor R1 and a capacitor C1, and the second CR integrator comprises a resistor R15 and a capacitor C2. The load control circuit 5 comprises a resistor R12, a load L and transistors T7 and T8.

The first decision element 2 comprises a transistor T2, and the first trigger circuit 4 comprises transistors T1 and T6 and resistors R2 and R3. The second decision element 6 comprises a transistor T10 and resistors R16 and R17, and the second trigger circuit 8 comprises transistors T4 and T9 and resistors R13 and R14. Operating voltage E for the timer is provided by a power source $E_B$.

Waveform A of FIG. 3 shows the voltage across the integrating capacitor C1; waveform B the base current of the transistor T6; waveform C the ON and OFF states of the transistor T3; waveform D the voltage across the integrating capacitor C2; waveform E the base current of the transistor T4; and waveform F the ON and OFF states of the transistor T5.

The first mode of operation will now be described in detail.

Assume that at time $t_o$ transistor T3 in the flip-flop 1 is driven into the OFF state and transistor T5 into the ON state. Then the transistor T2 is in the OFF state, whereas the transistors T7, T8 and T10 are in the ON state. The voltage across the capacitor C1 increases with time, whereas the voltage across the capacitor C2 is zero because the capacitor is short-circuited by the transistor T10. Since the transistor T8 is ON, power is supplied to the load L. (The above-described mode of operation is also provided by the embodiments to be described hereinafter with reference to FIGS. 4–14.)

The base of the transistor T1 is connected to the junction of resistors R2 and R3 which divide the voltage E of the power source $E_B$ so that at the time when the voltage across the capacitor C1 (the emitter potential) increases beyond the base potential determined by the ratio of the resistors R2 and R3, that is, when the emitter potential exceeds the threshold voltage Vs1 between the emitter and base of the transistor T1, the transistor T1 is driven into the ON state. The time $(t_o - t_1)$ required for the first CR integrator 3 to drive the transistor T1 from the initial integration state into the ON state is determined by:

$$t_o - t_1 = \mathrm{C1\ R1}\ \log_e \frac{E}{E\left(1 - \dfrac{\mathrm{R3}}{\mathrm{R2} + \mathrm{R3}}\right) - \mathrm{Vs1}}$$

When the transistor T1 is driven into the ON state, the collector current thereof flows into the base of the transistor T6 to drive it into the ON state. Therefore, the base potential of the transistor T5 becomes zero so that the transistor T5 is driven into the OFF state, whereas the transistor T3 is driven into the ON state. As a result, the transistor T2 is driven into the ON state so that the capacitor C1 is short-circuited by the transistor T2. Therefore, the voltage across the capacitor C1 becomes zero, and the transistor T1 is driven into the OFF state. The base current flowing into the transistor T6 then becomes zero. Thus, the base current of transistor T6 is a pulse as shown in FIG. 3, waveform B. When transistor T5 is driven into the OFF state, the transistors T7, T8 and T10 are also driven into the OFF state so that the voltage across the capacitor C2 can increase with time. That is, the operation of the second CR integrator is initiated. Since the transistor T8 is OFF, no power is supplied to the load L. The circuits are in the states indicated between times $t_1$ and $t_2$ in FIG. 3.

When the voltage across the capacitor C2 and the emitter potential of the transistor T9 increases beyond a reference voltage determined by the resistors R13 and R14, that is, when the emitter potential exceeds the threshold voltage Vs2 between the base and emitter of the transistor T9, the transistor T9 is driven into the ON state. The time $(t_1 - t_2)$ required for the second CR integrator to drive the transistor T9 ON is determined by:

$$t_1 - t_2 = C2\ R15\ \log_e \frac{E}{E\left(l - \frac{R14}{R15 \approx R14}\right) - Vs2}$$

When the transistor T9 is driven into the ON state, the collector current thereof flows into the base of the transistor T4 to drive it into the ON state. Therefore, the base potential of the transistor T3 becomes zero so that the transistor T3 is driven into the OFF state and transistor T5 into the ON state. The transistors T7, T8 and T10 are also driven into the ON state so that the capacitor C2 is short-circuited by the transistor T10. As a consequence, the voltage across the capacitor C2 becomes zero so that the transistor T9 is driven into the OFF state. Therefore, the base current of the transistor T4 becomes zero. Thus, the base current is in the form of a pulse as shown in waveform E of FIG. 3.

Since the transistor T8 is driven into the ON state, power is supplied to the load L and the voltage across the capacitor C1 increases with time. The subsequent mode of operation between $t_2$ and $t_3$ is substantially similar to that shown between $t_0$ and $t_1$. Thereafter, the operations are continuously cycled in the manner described hereinbefore.

As described hereinbefore, in the first embodiment power is supplied to the load L during a time $t_0$—$t_1$ which is determined by the first CR integrator 3 and the first trigger circuit 4, and the supply of power to the load L is interrupted during a time $t_1$—$t_2$ which is determined by the second CR integrator 7 and the second trigger circuit 8. The duration of the ON and OFF time intervals may be selected independently of each other by adjusting variable resistors R1 and R15.

Figure 4:
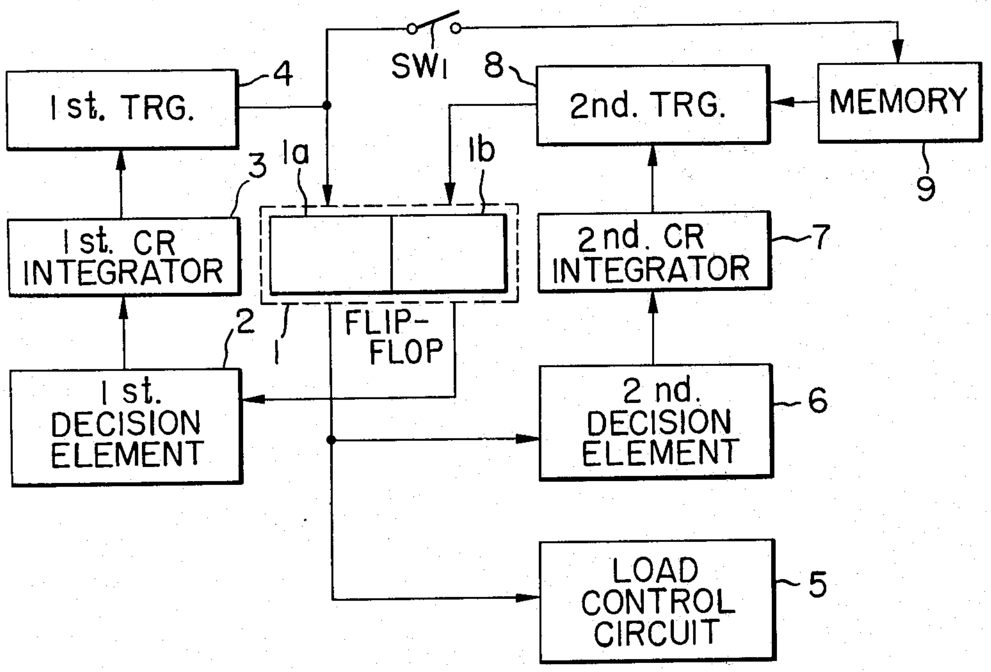
FIG. 4 is a block diagram of a second embodiment of the present invention.

Second Embodiment, FIG. 4

The second embodiment shown in block diagram in FIG. 4 is capable of a second mode of operation wherein, after actuation of a control switch, the load control circuit is first driven into and held in the ON state for a predetermined time interval and then is driven into and continuously held in the OFF state. The circuit is substantially similar to the first emodiment described hereinbefore except that an interrupter circuit in the form of a amemory 9 is connected to the second trigger circuit 8. The memory 9 has set and reset states. When the memory 9 is set, the second trigger 8 is disabled so that no trigger signal is applied to the element 1b in the flip-flop 1. The memory 9 is adapted to be driven into the set state from the reset state in response to the trigger signal from the first trigger circuit 4 when switch SW1 is closed and to be held in the set state until it is reset.

The second mode of operation will now be described. Assume that the memory 9 is in the reset state when the switch SW1 is open. Then the second trigger 8 is not disabled so that the mode of operation is identical to that of the first embodiment, that is, the ON and OFF operations are cycled continuously in accordance with the first mode of operation.

When the switch SW1 is closed, the memory 9 is in the reset state until the first trigger circuit 4 provides a trigger signal. Therefore, the periodic ON-OFF operations are cycled as in the case when the switch SW1 is open. In response to the trigger signal from the first trigger circuit 4, the element 1*a* in the flip-flop 1 is driven into the OFF state and the element 1*b* into the ON state. The first decision element 2 is driven into the state for setting the CR integrator 3 to the initial state and the load control circuit 5 is driven into the OFF state. The second decision element 6 is driven into the state for releasing the second integrator from the initial state so that the integrator commences integration. In response to the trigger signal from the first trigger circuit 4, the memory 9 is driven into the set state. That is, the memory 9 stores information. Since the memory 9 is held in the set state even when the voltage across the capacitor in the second CR integrator 7 reaches a predetermined level, the second trigger circuit 8 is disabled so that no trigger signal is provided. As a result, the ON-OFF operation is interrupted so that the control circuit 5 is held in the OFF state in accordance with the second mode of operation.

Figure 5:
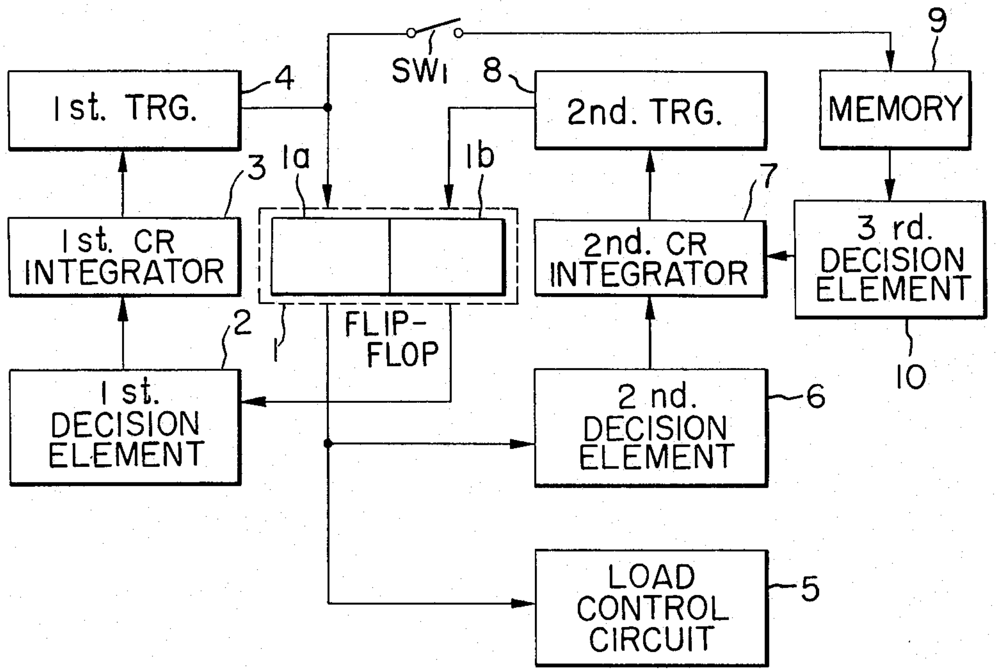
FIG. 5 is a block diagram of a third embodiment of the present invention.

Third Embodiment, FIG. 5

The third embodiment shown in FIG. 5 is capable of the first and second modes of operation and is substantially similar in construction to the second embodiment except that a third initial state decision circuit 10 is inserted between the memory 9 and the second CR integrator 7. The third decision element 10 is adapted to be driven into the state for releasing the CR integrator 7 from the initial state when the memory 9 is reset and into the state for setting the integrator to the initial state when the memory 9 is set. The second CR integrator 7 is controlled by both the second and third decision circuits 6 and 10 to be driven into the initial state. That is, the second CR integrator 7 is driven into the initial state in response to the control signal from either of the decision elements 6 or 10.

The mode of operation of the third embodiment is as follows: When the switch SW1 is open, the ON-OFF operation is repeated as in the case of the second embodiment shown in FIG. 4. When the switch SW1 is closed, the ON-OFF operation is repeated until the first trigger circuit 4 provides a trigger signal. Specifically, when the element 1a in the flip-flop 1 is driven into the OFF state and the element 1*b* into the ON state in response to the trigger signal from the first trigger circuit 4, the first decision element 2 is driven into the state for setting CR integrator 3 to the initial state. The load control circuit 5, connected to element 1*a* of the flip-flop, is driven into the OFF state. The second decision circuit 6 is driven into the state for releasing the integrator 7 from the initial state. The memory 9 is triggered in response to the trigger signal from the first trigger circuit 4 and driven into the set state. That is, the trigger signal is stored. As a consequence, the third decision element 10 is held in the state for setting the integrator 7 to the initial state so that the integration by the second CR integrator 7 cannot be carried out. Therefore, the second trigger circuit 8 is disabled so that the ON-OFF operation is interrupted. Thus, the load control circuit 5, being connected to element 1*a* of the flip-flop, is continuously held in the OFF state in accordance with the second mode of operation.

Figure 6:
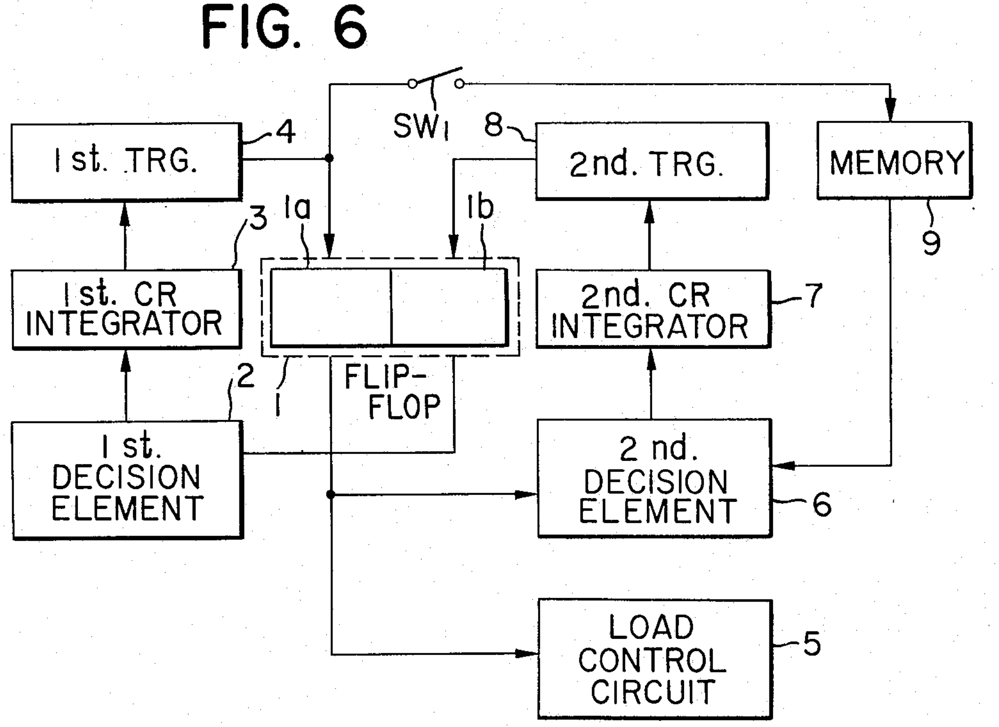
FIG. 6 is a block diagram of a fourth embodiment of the present invention.
Figure 8:
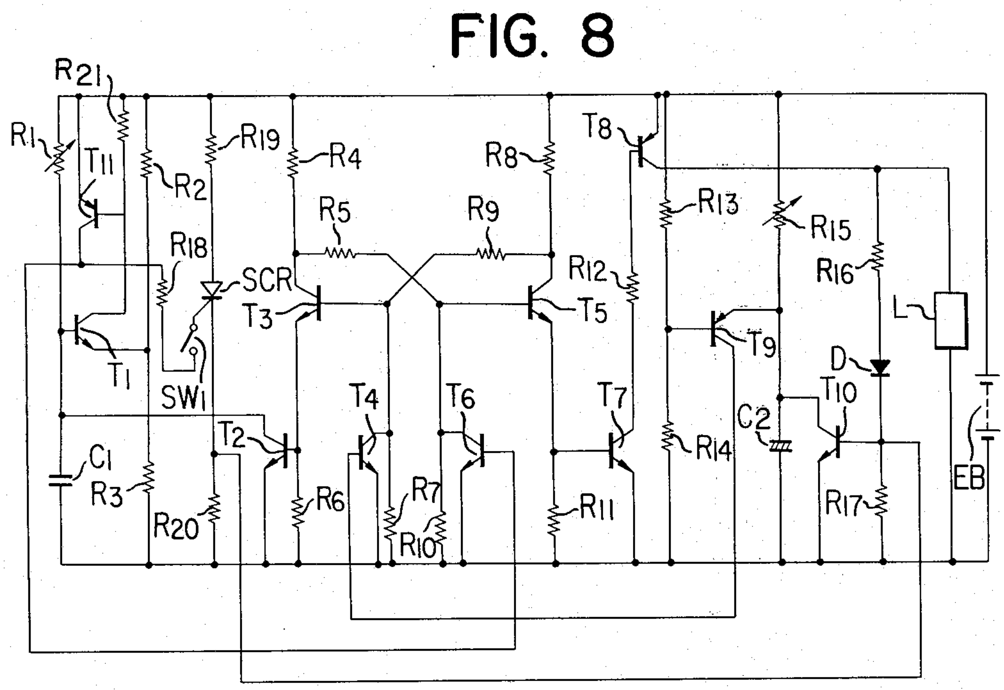
FIGS. 8 and 9 are circuit diagrams of the fourth and fifth embodiments shown in FIGS. 6 and 7, respectively.

Fourth Embodiment, FIGS. 6 and 8

The fourth embodiment shown in FIG. 6, which is also capable of the first and second modes of operation, is substantially similar in construction to the second embodiment shown in FIG. 4 except that the output of the memory 9 is applied to the second decision element 6 instead of the second trigger circuit 8. Therefore, the second decision circuit 6 is controlled in response to the control signals from both the flip-flop 1 and the memory 9. More particularly, the second decision circuit 6 is controlled in response to the signal from the flip-flop 1 when the memory 9 is reset, but when the memory 9 is set, the second decision element 6 is driven into the state for setting integrator 7 to the initial state independently of the state of the flip-flop 1.

When the switch SW1 is open, the ON-OFF operation is cycled continuously as in the case of the second embodiment. When the switch SW1 is closed, the ON-OFF operation is cycled until the first trigger circuit 4 generates a trigger signal. In response to the trigger signal, the element 1*a* in the flip-flop 1 is driven into the OFF state and the element 1*b* into the ON state, so that in response to the control signal from the flip-flop 1, the second decision element 6 is driven into the state for setting integrator 7 to the initial state. However, the memory 9 is simultaneously triggered into the set state and the second decision element 6 is held thereby in the state for setting integrator 7 to the initial state. Therefore, the ON-OFF operation is interrupted and the load control circuit 5 is continuously held in the OFF state.

Figure 7:
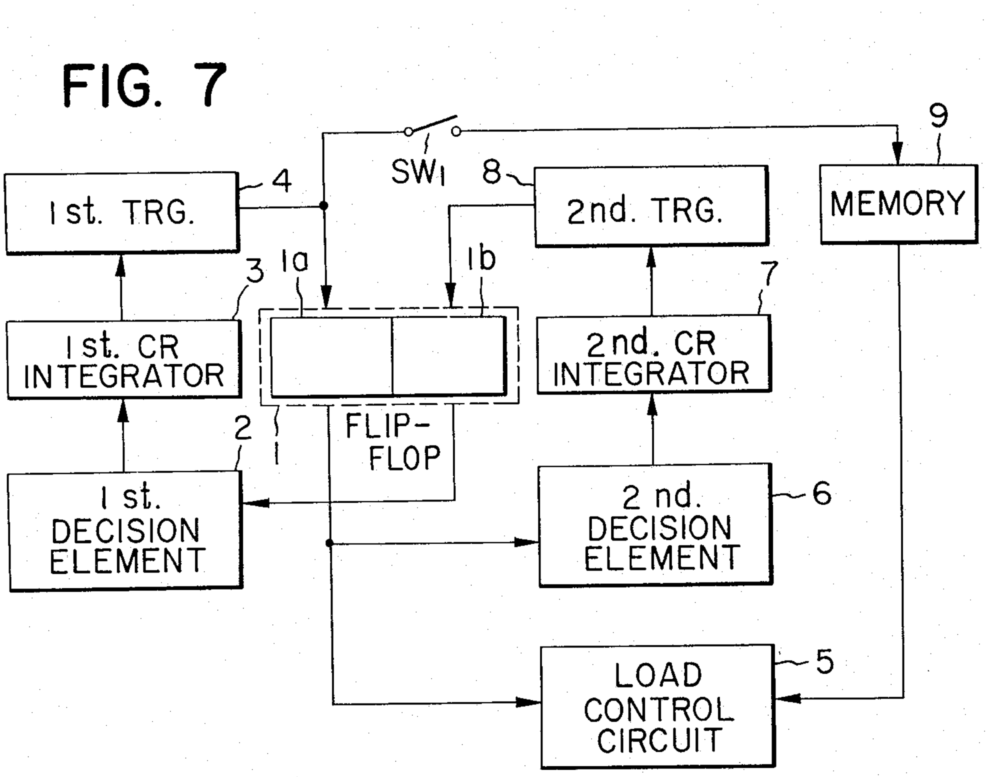
FIG. 7 is a block diagram of a fifth embodiment of the present invention.
Figure 9:
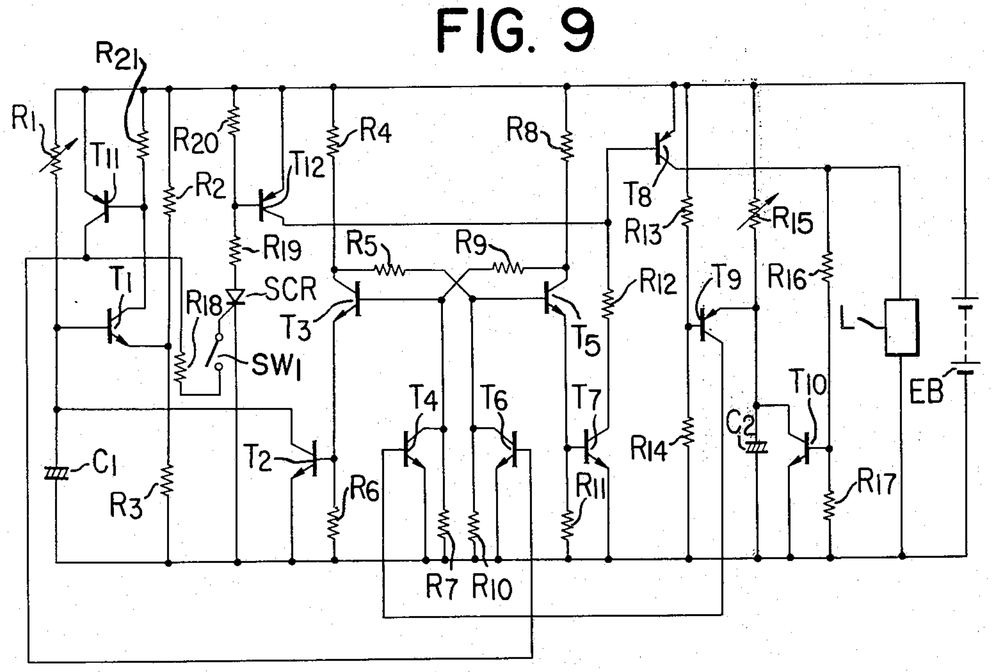

Fifth Embodiment, FIGS. 7 and 9

The fifth embodiment shown in FIG. 7, which is also capable of the first and second modes of operation, is substantially similar in construction to the fourth embodiment shown in FIG. 6, except that the output of the memory 9 is connected to the load control circuit 5 instead of the second decision element 6. Therefore, the load control circuit 5 is controlled in response to the control signals from both the flip-flop 1 and the memory 9. That is, the load control circuit 5 is controlled in response to the signal from the flip-flop 1 when the memory 9 is reset, but may be driven into the OFF state in response to the set signal from the memory 9 independently of the control signal from the flip-flop 1.

When the switch SW1 is open, the ON-OFF operation is continuously cycled as in the case of the second embodiment shown in FIG. 4. When the switch SW1 is closed and before the first trigger circuit 4 generates the trigger signal, the ON-OFF operation continues. However, in response to the trigger signal from the first trigger circuit 4, the memory 9 is triggered to the set state so that the load control circuit 5 is continuously held in the OFF state.

Fourth Embodiment, FIG. 8

FIG. 8 shows a circuit diagram of the fourth embodiment shown in block diagram in FIG. 6. The flip-flop 1, the first and second integrators 3 and 7 and the load control circuit 5 are similar in construction to those in the first embodiment shown in FIG. 1. The first trigger circuit 4 conprises transistors T1, T11 and T6, and resistors R2, R3, R18 and R21; the second decision element 6 and the load control circuit 5 comprise a transistor T10, resistors R16 and R17, and a diode D; and the second trigger circuit 8 comprises resistors R13 and R14, and transistors T4 and T9. The memory 9 comprises a thyristor or SCR and resistors R19 and R20. The thyristor or SCR is non-conducting or OFF when the memory is in the reset state and is driven into the conducting or ON state when the memory 9 is set. After the switch SW1 is closed, when the transistor T11 in the trigger circuit 4 is driven into the ON state, the thyristor or SCR is triggered into the ON state so that the voltage across the resistor 20, that is, the output of the memory 9, is applied to the base of the transistor T10 in the second decision element 6 to hold the transistor T10 in the ON state.

The mode of operation of the circuit of FIG. 8 will now be described. Assume that the transistor T3 in the flip-flop 1 is in the OFF state and the transistor T5 is in the ON state and that the thyristor or SCR is OFF with the switch SW1 being open. Then the transistor T2 is in the OFF state, whereas the transistors T7, T8 and T10 are in the ON state. Therefore, the voltage across the capacitor C1 increases with time, whereas, the voltage across the capacitor C2, short-circuited by the transistor T10, is zero. Since the transistor T8 is in the ON state, power is supplied to the load L. The potential across capacitor C1 and hence the base potential of the transistor T1 exceeds the emitter potential thereof after a predetermined time interval so that the transistor T1 is driven into th ON state. Consequently, the transistors T11 and T6 are driven into the ON state so that the transistor T3 in the flip-flop 1 is driven into the ON state and the transistor T5 into the OFF state. Therefore, the transistor T2 is driven into the ON state, short-circuiting capacitor C1. Thus, the capacitor C1 is set into the initial state.

When the transistor T5 is driven into the OFF state, the transistors T8, T7 and T10 are also driven into the OFF state so that the voltage across the capacitor C2 starts to increase with time. Since the transistor T8 is driven into the OFF state, no power is supplied to the load L. When the voltage across the capacitor C2 and hence the emitter potential of the transistor T9 exceeds the base potential after a predetermined time interval, the transistor T9 is driven into the ON state so that the transistor T4 is also driven into the ON state. As a result, the transistor T3 in the flip-flop 1 is driven into the OFF state and the transistor T5 into the ON state. Thereafter, the same ON-OFF operation is cycled continuously.

After the switch SW1 is closed, the ON-OFF operation is continued until the transistor T11 is driven into the ON state. In operation with the switch SW1 closed, when the voltage across capacitor C1 exceeds the emitter potential of transistor T1, the transistor T1 is driven into the ON state so that the transistors T11 and T6 are also driven into the ON state and the thyristor or SCR is triggered into the ON state. Furthermore, when transistor T11 is driven into the ON state, the flip-flop 1 reverses its state. That is, the transistor T3 is driven into the ON state and the transistor T5 into the OFF state. The transistorss T8 and T7 are also driven into the OFF state. Since the thyristor or SCR is in the ON state, the transistor T10 is not driven into the OFF state, but is held in the ON state. As a result, the capacitor C2 remains in the initial integration state so that the ON-OFF operation is interrupted. That is, the transistor T8 remains in the OFF state so that the control circuit 5 is continuously held in the OFF state.

Fifth Embodiment, FIG. 9

FIG. 9 shows a circuit diagram of the fifth embodiment shown in block diagram in FIG. 7.

The circuit shown in FIG. 9 is substantially similar in construction to the circuit shown in FIG. 8 except that the diode D is removed and a transistor T12 is inserted.

When the switch SW1 is closed and the thyristor SCR is subsequently triggered into the ON state, the transistor T12 is also driven into the ON state. As a consequence, the base potential of the transistor T8 in the load control circuit 5 becomes equal to the emitter potential thereof so that the transistor T8 is driven into the OFF state regardless of the control signal from the flip-flop 1. Thus, the load control circuit 5 is continuously held in the OFF state.

In the embodiments described hereinbefore, the timer is disabled with the load control circuit 5 held in the OFF state, but it is understood that by suitable modification the timer may be operated in a third mode wherein, after actuation of the switch SW1, the load control circuit is first driven into and held in the OFF state for a predetermined time interval and then is driven into and continuously held in the ON state. Furthermore, instead of a thyristor or SCR, a flip-flop with complementary circuits of PNP and NPN transistors with positive feedback may be used. In summary, according to the second and third embodiments, the repeat cycle timer can be disabled with the load control circuit being automatically held in the ON or OFF state when the switch SW1 is closed.

Sixth Embodiment, FIGS. 10–14

Figure 10:
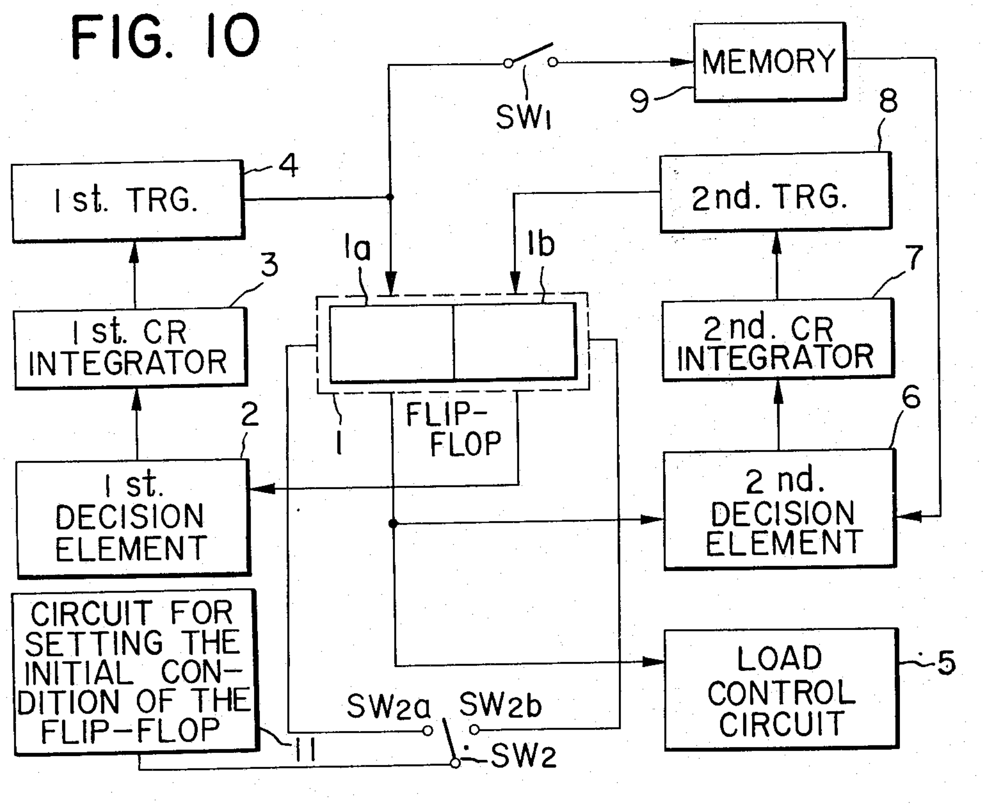
FIG. 10 is a block diagram of a sixth embodiment of the present invention.

A sixth embodiment capable of operating in the first, second, and fourth modes is shown in block diagram in FIG. 10. In the fourth mode of operation, actuation of a switch causes the load circuit to first be driven into and held in the OFF state for a predetermined time internal, and then to be driven into and held in the ON state for a predetermined time interval, and finally to be driven into and continuously held in the OFF state. This embodiment is substantially similar in construction to the fourth embodiment described hereinbefore with reference to FIG. 6 except that a circuit 11 for setting the initial state or condition of the flip-flop 1 is connected to the flip-flop through a switch SW2. For example, with the movable arm or armature of the switch SW2 closing the contact SW2*a*, the element 1*a* in the flip-flop 1 is driven into the OFF state when an actuating switch (switch SW3 of FIG. 11) is closed.

Figure 11:
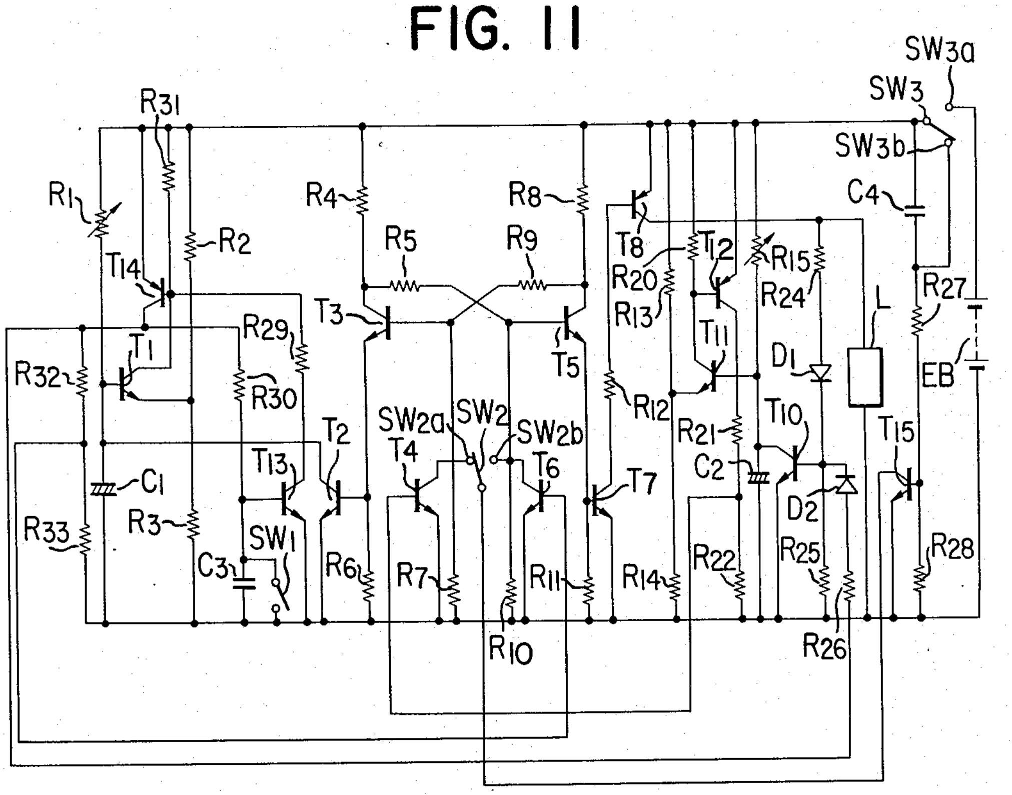
FIG. 11 is a circuit diagram thereof.

FIG. 11 shows a circuit diagram of the sixth embodiment of the timer selectable into the various modes of operation of the timer by selection switches SW1 and SW2. The sixth embodiment is multi-purpose timer particularly adapted to be used for controlling the motor in a motor-driven camera. The flip-flop 1, the first and second CR integrators 3 and 7, and the load control circuit 5 are substantially similar to those of the first embodiment. The first decision element comprises a transistor T2; the first trigger circuit comprises transistors T1, T14 and T6, and resistors R2, R3, R31, R32 and R33; the second decision circuit comprises a transistor T10, resistors R24, R25 and R26, and blocking diodes D1 and D2; and the second trigger circuit comprises transistors T11, T12 and T4, and resistors R13, R14, R20, R21, and R22. The circuit 11 for setting the initial condition of the flip-flop 1 comprises a transistor T15, resistors R27 and R28 and a capacitor C4; and the memory 9 comprises a transistor T13, resistors R30 and R29, and a capacitor C3. A start switch SW3 has two stationary contacts SW3*a* and SW3*b*. When the contact SW3*a* is closed, the CR timer circuit is actuated, whereas when the contact SW3*b* is closed, the operation of the timer is interrupted. The initial condition setting switch SW2 has stationary contacts SW2*a* and SW2*b*. The switch SW1 is for actuating the memory 9. That is, when the switch SW1 is open, the memory 9 is actuated.

Figure 12:
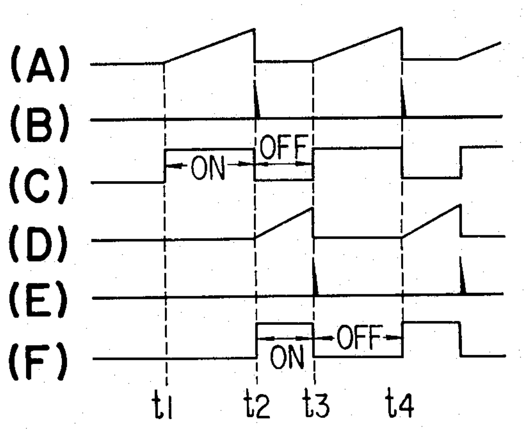
FIGS. 12, 13 and 14 are explanatory timing diagrams illustrating the various modes of operation thereof.

Operation of the timer in the first mode will now be described with reference to FIG. 12. When switch SW1 is closed, the timer may be operated in the first mode described above with respect to the embodiment of FIG. 1. To initiate operation in the first mode, contact SW3*a* of actuating switch SW3 is closed. Thereafter, the time continuously repeats cycles wherein the load control circuit 5 is held in the ON state for a time interval which is determined by the first CR integrator and then is switched to and held in the OFF state for a time interval which is determined by the second integrator 7. Thus, the ON-OFF operation is cycled as shown in FIG. 12. In FIG. 12 waveform A shows the voltage across the capacitor C1; waveform B the base current of the transistor T6; waveform C the ON and OFF states of the transistor T5; waveform D the voltage across the capacitor C2; waveform E the base current of the transistor T4; and waveform F the ON-OFF states of the transistor T3.

After switch SW1 is closed and the contact SW2*a* of the switch SW2 is closed, contact SW3a of the actuating switch SW3 is closed at time $t_1$. Thus, power is supplied to the timer at time $t_1$ and the capacitor C4 is charged within a very short period of time so that the transistor T15 is driven into the ON state. Therefore, the transistor T3 in the flip-flop 1 is driven into the OFF state and the transistor T5 is driven into the ON state so that the transistors T7, T8 and T10 are also driven into the ON state. The capacitor C2 in the second CR integrator 7 is short-circuited by the transistor T10 so that the voltage across the capacitor C2 is zero. Because the transistor T8 is driven into the ON state, power is supplied to the load L. The transistor T3 is in the OFF state so that the capacitor C1 is not short-circuited by the transistor T2. Therefore, the voltage across the capacitor C1 increases with time as shown at A in FIG. 12. When the voltage across the capacitor C1 increases sufficiently, the transistor T1 is driven into the ON state at time $t_2$ in FIG. 12 so that transistors T14 and T10 are also driven into the ON state. The switch SW1 short-circuits the base and emitter of the transistor T13 so that the transistor is held in the OFF state. When the transistor T6 is driven into the ON state, the transistor T3 in the flip-flop 1 is driven into the ON state and the transistor T5 into the OFF state so that the transistor T2 is driven into the ON state and the voltage across the capacitor Cl is zero. Thus, the transistors T1 and T14 are again driven into the OFF state. Therefore, a pulse-shaped current is applied to the base of transistor T6 as indicated at B in FIG. 12. Because the transistor T5 is driven into the OFF state, the transistors T7, T8 and T10 are also driven into the OFF state. Thus, the supply of power to the load L is interrupted.

The voltage across the capacitor C2 increases with time as indicated at D in FIG. 12 to a point at which the transistor T11 is driven into the ON state at time $t_3$ in FIG. 12. Therefore, the transistors T12 and T4 are also driven into the ON state so that the transistor T3 in the flip-flop 1 is driven into the OFF state and the transistor T5 into the ON state. The transistors T7, T8 and T10 are also driven into the ON state and the voltage across capacitor C2 is driven to zero. Therefore, the transistors T11, T12 and T4 are also driven into the OFF state again so that a pulse-shaped current is applied to the base of the transistor T4 as indicated at E in FIG. 12. Since the transistor 8 is driven into the ON state, power is supplied to the load L and the voltage across the capacitor increases again as a function of time as indicated at A between $t_3$ and $t_4$ in FIG. 12. Thus, the ON-OFF operation is cycled in a manner substantially similar to that described hereinabove with reference to the embodiment of FIG. 1 until switch SW1 is opened.

In the above description, the contact SW2*a* has been closed, but it will be understood that a similar ON-OFF operation may be obtained when the contact SW2*b* is closed. However, it should be noted that when the contact SW2*a* is closed, the load control circuit 5 is first driven into the ON state and then switched into the OFF state, but when the contact SW2*b* is closed, the control circuit is first driven into the OFF state and then switched into the ON state.

Figure 13:
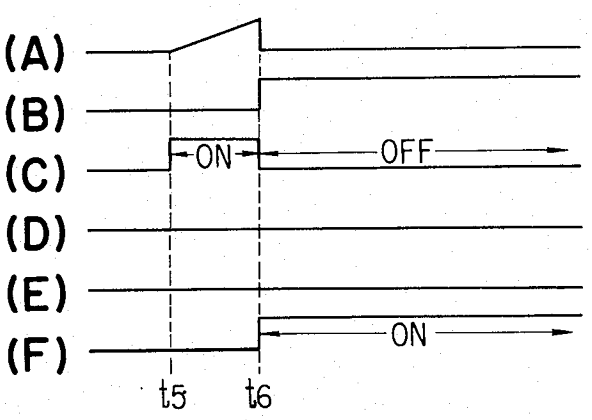

Operation of the timer of FIG. 10 in the second mode of operation, wherein the load control circuit 5 is driven into and held in the ON state for a time interval determined by the first CR integrator and then switched into and continuously held in the OFF state will now be described with reference to FIG. 13.

With switch SW1 open and the contact SW2a closed, the contact SW3a is closed. The transistor T15 is immediately driven into the ON state, and the transistor T5 in the flip-flop 1 is driven into the ON state so that the transistors T7, T8 and T10 are also driven into the ON state. Because transistor T8 is in the ON state, power is supplied to the load L. Since the transistor T10 is in the ON state, the capacitor C2 is short-circuited. That is, the initial integration state is set up. The transistor T3 is in the OFF state so that the transistor T2 is driven into the OFF state. Therefore, the voltage across the capacitor C1 increases with time as indicated between $t_5$ and $t_6$ in FIG. 13. When the voltage across the capacitor C1 reaches a predetermined level, the transistor T1 is driven into the ON state at $t_6$ in FIG. 13 so that the transistor T14 is also driven into the ON state.

Memory 9 operates in the following manner. The base of the transistor T13 is connected to the collector of the transistor T14 through the resistor R30 and the base of the transistor T14 is connected to the collector of the transistor T13 through the resistor R29 so that positive feedback is provided. When the transistor T1 is driven into the ON state, the transistors T13 and T14 are driven into and held in the ON state. The capacitor C3 is inserted in order to prevent erratic operation due to the noise produced when the power source is connected. Since the transistor T14 is held in the ON state, the transistors T6 and T10 are also held in the ON state, and since the transistor T6 is held in the ON state, the transistor T3 in the flip-flop 1 is held in the ON state. The transistor T2 is also driven into the ON state so that the voltage across the capacitor C1 becomes zero. The transistor T1 is driven into the OFF state, but the transistor T14 is held in the ON state so that the transistor T10 is also held in the ON state. Therefore, the voltage across the capacitor C2 remains zero.

The transistor T5 is held in the OFF state so that the transistors T7 and T8 are also driven into the OFF state. As a result, no power is supplied to the load L. The flip-flop 1 will not reverse its states so that power is not supplied to the load L after $t_6$.

Figure 14:
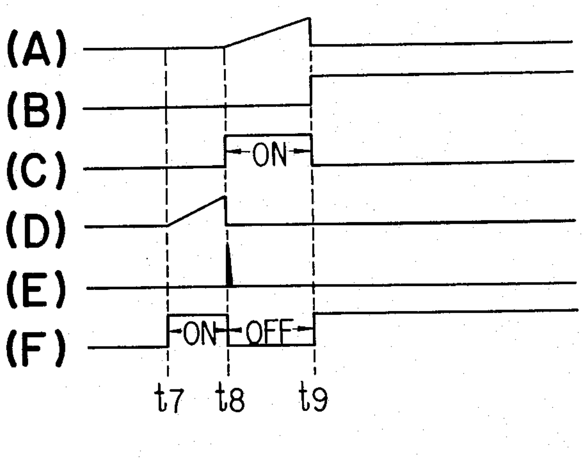

The fourth mode of operation will be described with reference to FIG. 14. In the fourth mode of operation, upon closing switch SW3 the load control circuit 5 is driven into the OFF state for a time interval determined by the second CR integrator, is then held in the ON state for a predetermined time determined by the first CR integrator, and is thereafter driven into and continuously held in the OFF state.

With the memory switch SW1 open and the contact SW2*b* closed, contact SW3*a* of switch SW3 is closed to initiate operation in the fourth mode. The transistor T15 is driven into the ON state for a short period of time so that the transistor T5 in the flip-flop 1 is driven into the OFF state and transistor T3 into the ON state. Therefore, the transistor T2 in the first decision circuit is driven into the ON state and the capacitor C1 is thus set into the initial integration state with the voltage across the capacitor C1 being zero. Since the transistor T5 is held in the OFF state, the transistors T7, T8 and T10 are held in the OFF state. Therefore, the voltage across the capacitor C2 increases from time $t_7$ to $t_8$, during which period no power is supplied to the load L. When the voltage across the capacitor C2 increases to drive the transistor T11 into the ON state, the transistors T12 and T4 are also driven into the ON state. Therefore, the transistor T5 in the flip-flop 1 is driven into the ON state, driving the transistors T7, T8 and T10 into the ON state. The voltage across the capacitor C2 therefore drops to zero and power is supplied to the load L for the time interval starting at time $t_8$ in FIG. 14. The transistor T3 in the flip-flop 1 is driven into the OFF state so that the transistor T2 is also driven into the OFF state. The voltage across the capacitor C1 then increases as indicated in waveform A from time $t_8$ to $t_9$. When the voltage across the capacitor C1 increases to drive the transistor T1 into the ON state at time $t_9$, the transistor T14 is also driven into and held in the ON state in the manner described hereinbefore. Therefore, the transistors T6 and T10 are also held in the ON state, and the transistor T3 in the flip-flop 1 is driven into the ON state so that the voltage across the capacitor C1 drops to zero at time $t_9$ in FIG. 14. Since the transistor T5 is in the OFF state, the transistors T7 and T8 are driven into the OFF state so that no power is supplied to the load L. Since the transistor T6 is held in the ON state, the flip-flop remains in this state so that the transistor T8 is held in the OFF state. Thus, the interruption of the power supply to the load L is continued. In summary, in the fourth mode of operation, when switch contact SW3 is closed with the switch contact SW2*b* closed and the switch SW1 closed, the load control circuit 5 is driven into the ON state to supply the power to the load L after a time interval determined by the second CR integrator and held in the ON state for a time interval determined by the first CR integrator. Thereafter, the load control circuit 5 is continuously held in the OFF state.

In view of the above description of the fourth mode of operation, the fifth mode of operation in which the load control circuit 5 is first driven into the ON state, then switched into the OFF state and thereafter switched again into and continuously held in the ON state will be readily understood. In the fifth mode of operation, the load circuit is connected such that the load control circuit 5 is in the OFF state when the transistor T5 is in the ON state.

In the embodiments described hereinbefore, a reverse bias is applied to transistors T1 and T9 in the first and second trigger circuits 4 and 8 before they are triggered so that they exhibit a very high input impedance. As a result, long integration time constants for the CR integrators can be realized. Furthermore, all of the circuit components are DC interconnected so that the repeat cycle timer in accordance with the present invention may be used over a relatively wide voltage range.

Moreover, the present invention eliminates the need for a coupling capacitor so that the repeat cycle timer may be compact in size and in the form of an integrated circuit (IC). Thus, noise problems may be substantially eliminated.

As described hereinbefore, the present invention provides multipurpose CR timers which can be selected to operate in any one of five different modes of operation by simple switches. The CR timers of the present invention are therefore best adapted for use in automatic photography as self-timing motor control units for motor-driven cameras, but may be employed for activating and de-activating electrical circuits and cameras in general, such as those employing electromagnetically driven shutter releases, and for activating and de-activating associated equipment.

I claim:

1. A cycling timer with automatic interruption and hold comprising:

bistable means having first and second inputs for setting said bistable means to first and second states, respectively, said bistable means providing at respective output terminals first and second complementary signals in accordance with the state of said bistable means, first time delay means responsive to said first signal for generating a time-delayed third signal, second time delay means responsive to said second signal for generating a time-delayed fourth signal, means for coupling said third and fourth signals to said first and second inputs, respectively, of said bistable means whereby said bistable means is cycled between said first and second states, load control means connected to said bistable means and having different states responsive to the states of said bistable means, and hold means connected to said bi-stable means for causing said load control means to maintain a state thereof continuously after a predetermined time interval determined by the operation of said bistable means.

2. A timer as set forth in claim 1, wherein each of said delay means comprises integrating means, means responsive to the associated one of said first and second signals for setting the initial state of said integrating means, and threshold detecting means responsive to the associated one of said integrating means for producing one of said third and fourth signals.

3. A timer as set forth in claim 1, further comprising switch means for disabling said hold means.

4. A timer as set forth in claim 1, wherein said timer has start means for initiating operation of said load control timer, and means connected to said bistable means and said start means for selectively setting said bistable means to either one of said first and second states.

5. A timer as set forth in claim 1, wherein said hold means comprises memory means having set and reset states, and wherein said memory means is connected to one of said time delay means and is switched from said reset state to said set state in response to one of said third and fourth signals.

6. A load timer as set forth in claim 5, wherein said memory means comprises a pair of transistors having electrodes interconnected for positive feedback.

7. A timer as set forth in claim 5, wherein said memory means comprises a controlled rectifier.

8. A timer as set forth in claim 1, wherein said hold means comprises means having an output connected to said load control means independent of said bistable means

9. A timer as set forth in claim 8, wherein said hold means comprises means connected to said second time delay means for preventing said fourth signal from being applied to said second input of said bistable means.

10. A timer as set forth in claim 9, wherein said means for preventing said fourth signal from being applied to said second input comprises means for preventing said second time delay means from producing said fourth signal.

11. A timer as set forth in claim 10, wherein said second time delay means comprises integrating means, means responsive to said second signal for setting said integrating means in an initial state during one state of said bistable means and for permitting said integrating means to integrate during the other state of said bistable means, and trigger means responsive to said integrating means for producing said fourth signal.

12. A timer as set forth in claim 11, wherein said means for preventing said second time delay means from producing said fourth signal comprises means connected to said trigger means for disabling the same.

13. A timer as set forth in claim 11, wherein said means for preventing said second time delay means from producing said fourth signal comprises means connected to said integrating means for preventing integration by that integrating means.

14. A timer as set forth in claim 13, wherein said means for preventing integration comprises means for maintaining the last-mentioned integrating means in said initial state.

15. A timer as set forth in claim 13, wherein the last-mentioned integrating means comprises a series-connected resistor and capacitor, and wherein said means for preventing integration comprises transistor means connected to said capacitor for short-circuiting it.

* * * * *